United States Patent
Park et al.

(10) Patent No.: US 6,813,196 B2
(45) Date of Patent: Nov. 2, 2004

(54) HIGH SPEED INTERFACE TYPE SEMICONDUCTOR MEMORY DEVICE

(75) Inventors: Yong Jae Park, Seoul (KR); Se Jun Kim, Kyoungki-do (KR)

(73) Assignee: Hynix Semiconductor, Inc., Ich'on (KR)

(*) Notice: Subject to any disclaimer, the term of this patent is extended or adjusted under 35 U.S.C. 154(b) by 512 days.

(21) Appl. No.: 09/892,549

(22) Filed: Jun. 28, 2001

(65) Prior Publication Data

US 2002/0008997 A1 Jan. 24, 2002

(30) Foreign Application Priority Data

Jun. 30, 2000 (KR) .......................................... 2000-36894

(51) Int. Cl.[7] ................................................ G11C 7/00
(52) U.S. Cl. ...................................... 365/191; 365/233
(58) Field of Search ............................ 365/51, 63, 191, 365/193, 194, 233

(56) References Cited

U.S. PATENT DOCUMENTS 5,963,502 A * 10/1999 Watanabe et al. ........... 365/233
6,141,265 A * 10/2000 Jeon .............................. 365/194
6,359,481 B1 * 3/2002 Kim ............................. 327/141

FOREIGN PATENT DOCUMENTS

JP                11053296 A   *  2/1999   .......... G06F/13/16

* cited by examiner

*Primary Examiner*—Son Mai
(74) *Attorney, Agent, or Firm*—Pillsbury Winthrop LLP

(57) ABSTRACT

The present invention discloses a high speed interface type semiconductor memory device which can transmit data of a plurality of DRAMs of a module to a controller by using only one data strobe clock signal. The high speed interface type semiconductor memory device includes a DRAM module unit for generating a strobe clock signal for synchronizing a data signal in a read operation in a DRAM farthest from a controller among a plurality of DRAMs, providing the strobe clock signal to the other DRAMs, and transmitting data to the controller in the read operation, and a controller for transmitting a clock signal and data signals synchronized with the clock signal to the plurality of DRAMs, and receiving data signals from the DRAMs.

2 Claims, 2 Drawing Sheets

HIGH SPEED INTERFACE TYPE SEMICONDUCTOR MEMORY DEVICE

BACKGROUND OF THE INVENTION

1. Field of Invention

The present invention relates to a high speed interface type semiconductor memory device, and in particular to an improved high speed interface type semiconductor memory device which can transmit data of a plurality of DRAMs of a module to a controller by using only one data strobe clock signal.

2. General Background and Related Art

In general, through a read path, a signal amplified by a sense amp in a row address path is applied from a bit line to a data bus line according to selection of a column selector, re-amplified by a data bus line sense amp, and inputted to an output buffer. Through a write path, a data inputted from a data input buffer is applied to a sense amp. The read and write paths are called a data path.

A plurality of DRAMs are connected on one module in a system bus structure of a conventional semiconductor memory device. The DRAMs are controlled by a controller through a signal bus line.

The DRAMs connected to the signal bus line are controlled by one controller, and thus have a different phase difference in order to recognize a data and a control signal from the controller in an identical time. That is, the DRAM far from the controller rapidly processes the data, and the DRAM adjacent to the controller slowly processes the data.

The DRAMs controlled on the module by the controller are located in a different position. Thus, data strobe signals as many as the DRAMs are required to overcome skew of data from the respective DRAMs. The data output from the DRAMs during the read operation are synchronized with the data strobe signals, and transmitted to the controller.

In the conventional semiconductor memory device, the data strobe signals as many as the DRAMs are required to transmit the output data from the DRAMs to the controller. As a result, the conventional semiconductor memory device requires as many bus lines as there are data strobe signals, thereby occupying a large circuit area.

SUMMARY

The claimed inventions feature at least in part a high speed interface type semiconductor memory device which can transmit data of a plurality of DRAMs of a module to a controller by using one data strobe clock signal.

There is provided a high speed interface type semiconductor memory device including a DRAM module unit for generating a strobe clock signal for synchronizing a data signal in a read operation in a DRAM farthest from a controller among a plurality of DRAMs, providing the strobe clock signal to the other DRAMs, and transmitting data to the controller during the read operation. A controller transmits a clock signal and data signals synchronized with the clock signal to the plurality of DRAMs, and receives data signals from the DRAMs.

Each DRAM includes a first buffer for receiving main clock and clock bar signals from the controller. A second buffer buffers a first internal clock signal obtained by delay locking the main clock signal according to a control signal, and outputs data strobe clock and clock bar signals. A third buffer buffers and outputs the data strobe clock and clock bar signals according to the control signal. A DLL unit receives the output signal from the first buffer and the output signal from the third buffer, and outputs the first internal clock and clock bar signals, second internal clock and clock bar signals obtained by 90° phase-shifting the first internal clock and clock bar signals, third internal clock and clock bar signals, and fourth internal clock and clock bar signals obtained by 90° phase-shifting the third internal clock and clock bar signals. A first multiplexer unit selectively transmits the first internal clock and clock bar signals or the third internal clock and clock bar signals according to the control signal. A second multiplexer unit selectively transmits the second internal clock and clock bar signals or the fourth internal clock and clock bar signals according to the control signal. A read first-in first-out unit synchronizes and outputs a 4 bit read data according to the output signals from the first and second multiplexer units. A fourth buffer is connected between the read first-in first-out unit and a DQ pad. A fifth buffer receives a write data inputted through the DQ pad. A write first-in first-out unit receives the output signal from the fifth buffer, synchronizing the output signal according to the first internal clock and clock bar signals and the second internal clock and clock bar signals, and outputs a 4 bit write data. The first internal clock and clock bar signals and the third internal clock and clock bar signals are delay locked signals by the DLL unit receiving the main clock and clock bar signals.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION

Figure 1:
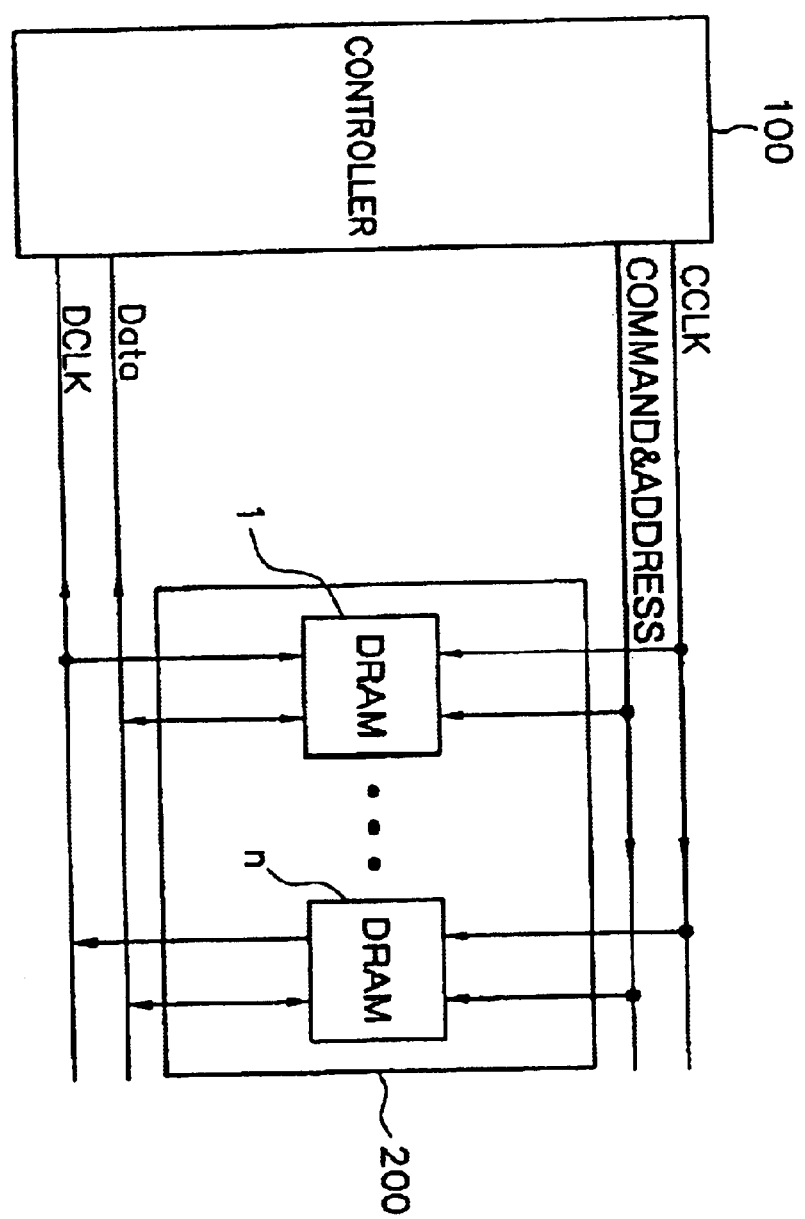
FIG. 1 schematically shows a system bus structure of a high speed interface type semiconductor memory device in accordance with the present invention.

A high speed interface type semiconductor memory device in accordance with a preferred embodiment of the present invention will now be described in detail with reference to the accompanying drawings. In the drawings, elements having an identical function are provided with the identical reference numeral, and repeated explanations thereof will be omitted.

The present invention relates to an SDRAM having a data I/O structure applicable to a high speed memory, and a system bus structure for supporting the SDRAM. First, the data I/O structure will be explained with reference to FIG. 1.

FIG. 1 illustrates the system bus structure of the high speed interface type semiconductor memory device in accordance with the present invention. The high speed interface type semiconductor memory device includes n DRAMs 1~n provided on one module 200. A controller 100 transmits a clock signal CCLK, and a command, address signal and data synchronized with the clock signal CCLK to the n DRAMs 1~n in a write operation, and receives data synchronized with a data strobe clock signal DCLK from the DRAMs 1~n in a read operation.

The data strobe clock signal DCLK is generated in the DRAM n farthest from the controller 100, and input to the other DRAMs and the controller 100.

That is, the DRAM n farthest from the controller 100 receives the clock signal CCLK from the controller 100, and generates an internal clock signal obtained by delay locking the clock signal CCLK. Thereafter, the DRAM n generates the data strobe clock signal DCLK for synchronizing the data signal in the read operation, by using the internal clock signal.

Therefore, the high speed interface type semiconductor memory device in accordance with the present invention can synchronize and transmit the data from the plurality of DRAMs 1~n to the controller 100, by using only one data strobe clock signal DCLK.

During a write operation, the high speed interface type semiconductor memory device synchronizes data with the clock signal CCLK from the controller 100, and transmits the data to the respective DRAMs 1~n. During a read operation, the high speed interface type semiconductor memory device synchronizes data from the respective DRAMs 1~n according to one data strobe clock signal DCLK from the DRAM n farthest from the controller 100, and transmits the data to the controller 100.

Figure 2:
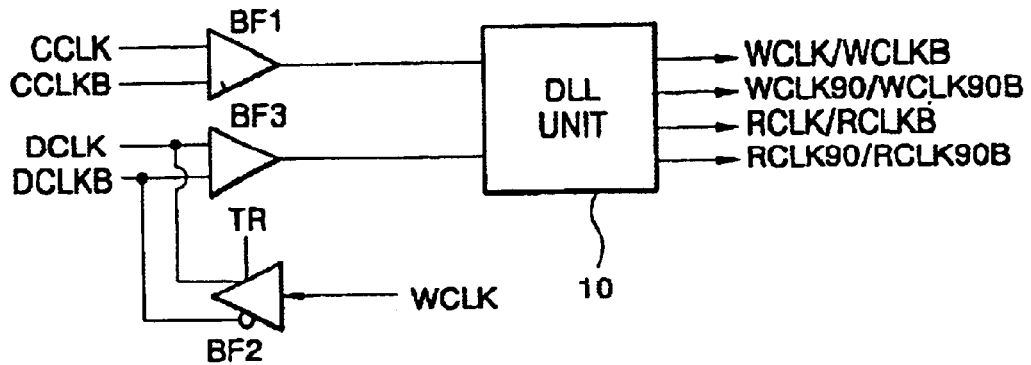
FIG. 2 schematically shows an internal structure of a DRAM of the high speed interface type semiconductor memory device in accordance with the present invention.
Figure 3:
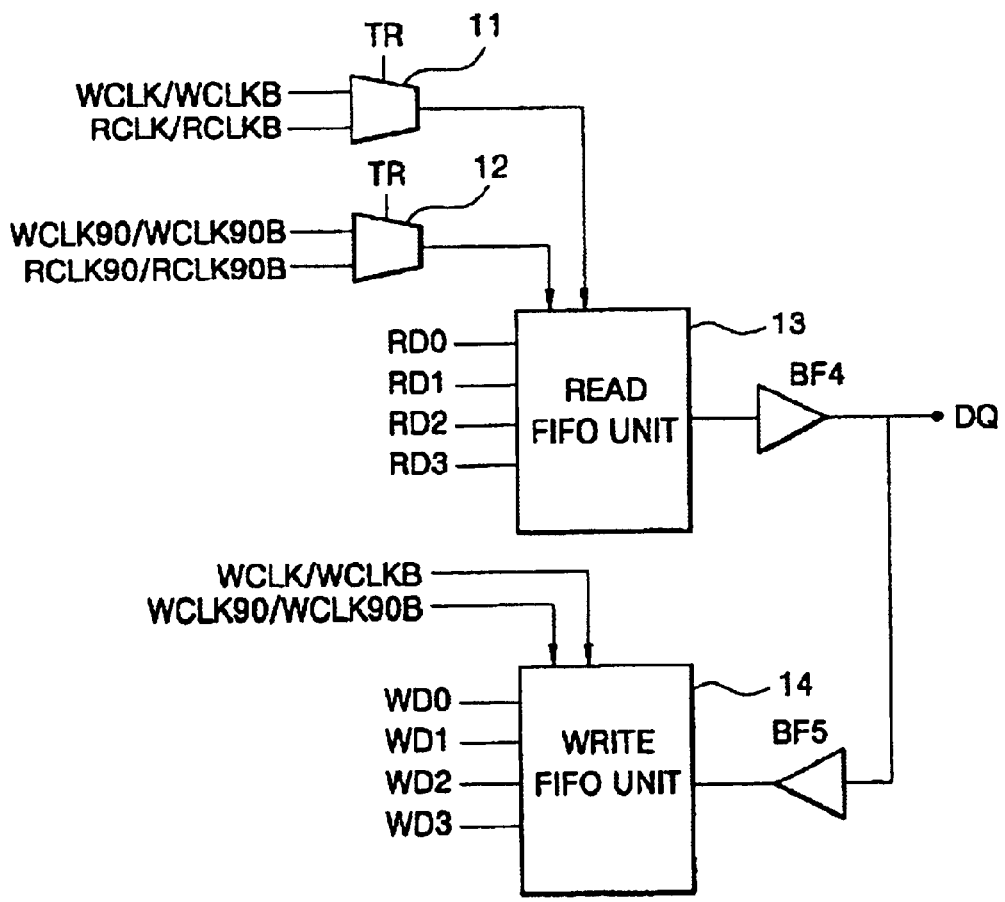
FIG. 3 schematically shows components of the high speed interface type semiconductor memory device in accordance with embodiments of the invention.

FIG. 2 illustrates an internal structure of the DRAM of the high speed interface type semiconductor memory device in accordance with the present invention, especially an internal structure of a quadruple data rate SDRAM.

The high speed interface type semiconductor memory device includes a first buffer BF1 for receiving a clock signal CCLK and a clock bar signal CCLKB from the controller 100. A second buffer BF2 buffers a write internal clock signal WCLK obtained by delay locking the clock signal CCLK when a control signal TR has a high level, and outputting a data strobe clock signal DCLK and a data strobe clock bar signal DCLKB. A third buffer BF3 buffers and outputs the data strobe clock and clock bar signals DCLK, DCLKB when the control signal is high. A DLL unit 10 receives the output signal from the first buffer BF1 and the output signal from the third buffer BF3, and outputs first internal clock and clock bar signals wclk, wclkb, second internal clock and clock bar signals wclk90, wclk90b obtained by 90° phase-shifting the first internal clock and clock bar signals wclk, wclkb, third internal clock and clock bar signals rclk, rclkb, and fourth internal clock and clock bar signals rclk90, rclk90b obtained by 90° phase-shifting the third internal clock and clock bar signals rclk, rclkb. The first internal clock and clock bar signals wclk, wclkb and the third internal clock and clock bar signals rclk, rclkb are delay locked signals by the DLL unit 10 receiving the clock signal CCLK.

The high speed interface type semiconductor memory device also includes a first multiplexer unit 11 for selectively transmitting the first internal clock and clock bar signals wclk, wclkb or the third internal clock and clock bar signals rclk, rclkb according to the control signal TR. A second multiplexer unit 12 for selectively transmitting the second internal clock and clock bar signals wclk90, wclk90b or the fourth internal clock and clock bar signals rclk90, rclk90b according to the control signal TR. A read first-in first-out unit 13 synchronizes and outputs a 4 bit read data RD0~RD3 according to the output signals from the first and second multiplexer units 11, 12. A fourth buffer BF4 is connected between the read first-in first-out unit 13 and a DQ pad. A fifth buffer BF5 receives a write data input through the DQ pad. A write first-in first-out unit 14 receives the output signal from the fifth buffer BF5, synchronizes the output signal according to the first internal clock and clock bar signals wclk, wclkb and the second internal clock and clock bar signals wclk90, wclk90b, and outputs a 4 bit write data WD0~WD3.

The n-th DRAM generates the data strobe clock signal DCLK by the second buffer BF2 receiving the first internal clock signal wclk from the DLL unit 10, when the control signal TR is high. Since the control signal TR is maintained low, the other DRAMs 1~n−1 do not generate the data strobe clock signal DCLK. That is, the DRAMs 1~n−1 receive the data strobe clock signal DCLK from the n-th DRAM. According to the input of the data strobe clock signal DCLK, the DLL unit 10 generates the third internal clock and clock bar signals rclk, rclkb having an identical delay to the data strobe clock signal DCLK, and the fourth internal clock and clock bar signals rclk90, rclk90b having a 90° phase difference from the third internal clock and clock bar signals rclk, rclkb.

The write operation of the quadruple data rate SDRAM will now be described. When receiving a data synchronized with the clock signal CCLK and a write command from the controller 100, the DRAM generates the first internal clock and clock bar signals wclk, wclkb delay locked by the DLL unit 10, and the second internal clock and clock bar signals wclk90, wclk90b. Thereafter, the DRAM respectively latches write data passing through the DQ pad and the input buffer BF5 according to the first internal clock and clock bar signals wclk, wclkb and the second internal clock and clock bar signals wclk90, wclk90b. Here, the latched data are transmitted to a write driver through an internal I/O bus, and stored in cells of a memory array. The n-th DRAM and the other DRAMs 1~n−1 perform different read operations.

Firstly, the n-th DRAM employs the first internal clock and clock bar signals wclk, wclkb and the second internal clock and clock bar signals wclk90, wclk90b to latch the data read from the memory cell array. The second buffer BF2 for outputting the data strobe clock signal DCLK is also operated.

The other DRAMs 1~n−1 output data by using the third internal clock and clock bar signals rclk, rclkb and the fourth internal clock and clock bar signals rclk90, rclk90b. The third internal clock and clock bar signals rclk, rclkb and the fourth internal clock and clock bar signals rclk90, rclk90b are clock signals generated from the DLL unit 10 receiving the data strobe clock signal DCLK from the n-th DRAM. Accordingly, the second buffer BF2 is not operated, and the first and third buffers BF1, BF3 are operated.

The above-described operation may also be applied to an SDRAM separately using the data strobe clock signal DCLK, such as a DDR SDRAM. In the conventional DDR SDRAM, bus lines for transmitting the data strobe clock signal DCLK must be provided in the respective DRAMs. However, according to the present invention, the plurality of DRAMs of the module can share one data strobe bus.

That is, the n-th DRAM farthest from the controller 100 generates the data strobe clock signal DCLK, and inputs the data strobe clock signal DCLK to the other DRAMs 1~n−1, thereby requiring only one data strobe clock signal.

As discussed earlier, the high speed interface type semiconductor memory device in accordance with the present invention can transmit data of the plurality of DRAMs on the module to the controller by employing only one data strobe clock signal.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A high speed interface type semiconductor memory device, comprising:

a controller constructed and arranged to transmit a clock signal and data signals synchronized with the clock signal to a plurality of DRAMs, and receive data signals from the DRAMs; and a DRAM module unit constructed and arranged to generate a strobe clock signal for synchronizing a data signal during a read operation in the DRAM farthest from the controller among the plurality of DRAMs, provide the strobe clock signal to the other DRAMs, and transmit data to the controller during the read operation, wherein each DRAM comprises:

a first buffer constructed and arranged to receive main clock and clock bar signals from the controller;

a second buffer constructed and arranged to buffer a first internal clock signal obtained by delay locking the main clock signal according to a control signal, and output data strobe clock and clock bar signals;

a third buffer constructed and arranged to buffer and output the data strobe clock and clock bar signals according to the control signal;

a DLL unit constructed and arranged to receive the output signal from the first buffer and the output signal from the third buffer, and output the first internal clock and clock bar signals, second internal clock and clock bar signals obtained by 90° phase-shifting the first internal clock and clock bar signals, third internal clock and clock bar signals, and fourth internal clock and clock bar signals obtained by 90° phase-shifting the third internal clock and clock bar signals;

a first multiplexer unit constructed and arranged to selectively transmit the first internal clock and clock bar signals or the third internal clock and clock bar signals according to the control signal;

a second multiplexer unit constructed and arranged to selectively transmit the second internal clock and clock bar signals or the fourth internal clock and clock bar signals according to the control signal;

a read first-in first-out unit constructed and arranged to synchronize and output a 4 bit read data according to the output signals from the first and second multiplexer units;

a fourth buffer connected between the read first-in first-out unit and a DQ pad;

a fifth buffer constructed and arranged to receive a write data inputted through the DQ pad; and a write first-in first-out unit constructed and arranged to receive the output signal from the fifth buffer, synchronize the output signal according to the first internal clock and clock bar signals and the second internal clock and clock bar signals, and output a 4 bit write data.

2. The device according to claim 1, wherein the first internal clock and clock bar signals and the third internal clock and clock bar signals are delay locked signals by the DLL unit receiving the main clock and clock bar signals.

* * * * *